(12) United States Patent
McNeil et al.

(10) Patent No.: US 12,170,113 B2
(45) Date of Patent: Dec. 17, 2024

(54) CONCURRENT PROGRAMMING OF RETIRED WORDLINE CELLS WITH DUMMY DATA

(71) Applicant: Micron Technology, Inc., Boise, ID (US)

(72) Inventors: Jeffrey S. McNeil, Nampa, ID (US); Kishore Kumar Muchherla, San Jose, CA (US); Sead Zildzic, Folsom, CA (US); Akira Goda, Tokyo (JP); Jonathan S. Parry, Boise, ID (US); Violante Moschiano, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 180 days.

(21) Appl. No.: 18/076,488

(22) Filed: Dec. 7, 2022

(65) Prior Publication Data
US 2023/0197163 A1    Jun. 22, 2023

Related U.S. Application Data

(60) Provisional application No. 63/292,026, filed on Dec. 21, 2021.

(51) Int. Cl.
  G11C 16/10    (2006.01)
  G11C 16/08    (2006.01)
  G11C 16/28    (2006.01)

(52) U.S. Cl.
  CPC ............ G11C 16/102 (2013.01); G11C 16/08 (2013.01); G11C 16/28 (2013.01)

(58) Field of Classification Search
  CPC .................................................. G11C 16/102
  See application file for complete search history.

(56) References Cited

U.S. PATENT DOCUMENTS

2018/0189154 A1*    7/2018    Zhu ...................... G06F 3/0659

* cited by examiner

*Primary Examiner* — Jason Lappas
(74) *Attorney, Agent, or Firm* — LOWENSTEIN SANDLER LLP

(57) ABSTRACT

A system includes a memory device including a memory array and control logic, operatively coupled with the memory array, to perform operations including receiving a set of commands to concurrently program a set of cells of the memory array with dummy data, the set of cells corresponding to a group of retired wordlines of the plurality of wordlines, in response to receiving the set of commands, obtaining the dummy data, and concurrently programming the set of cells with the dummy data by causing a ganged programming pulse to be applied to the set of cells.

20 Claims, 9 Drawing Sheets

CONCURRENT PROGRAMMING OF RETIRED WORDLINE CELLS WITH DUMMY DATA

RELATED APPLICATIONS

This application claims the benefit of U.S. Provisional Patent Application No. 63/292,026, filed on Dec. 21, 2021 and entitled "Concurrent Programming of Retired Wordline Cells with Dummy Data", the entire contents of which are incorporated by reference herein.

TECHNICAL FIELD

Embodiments of the disclosure relate generally to memory sub-systems, and more specifically, relate to concurrent programming of retired wordline cells with dummy data.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1A:
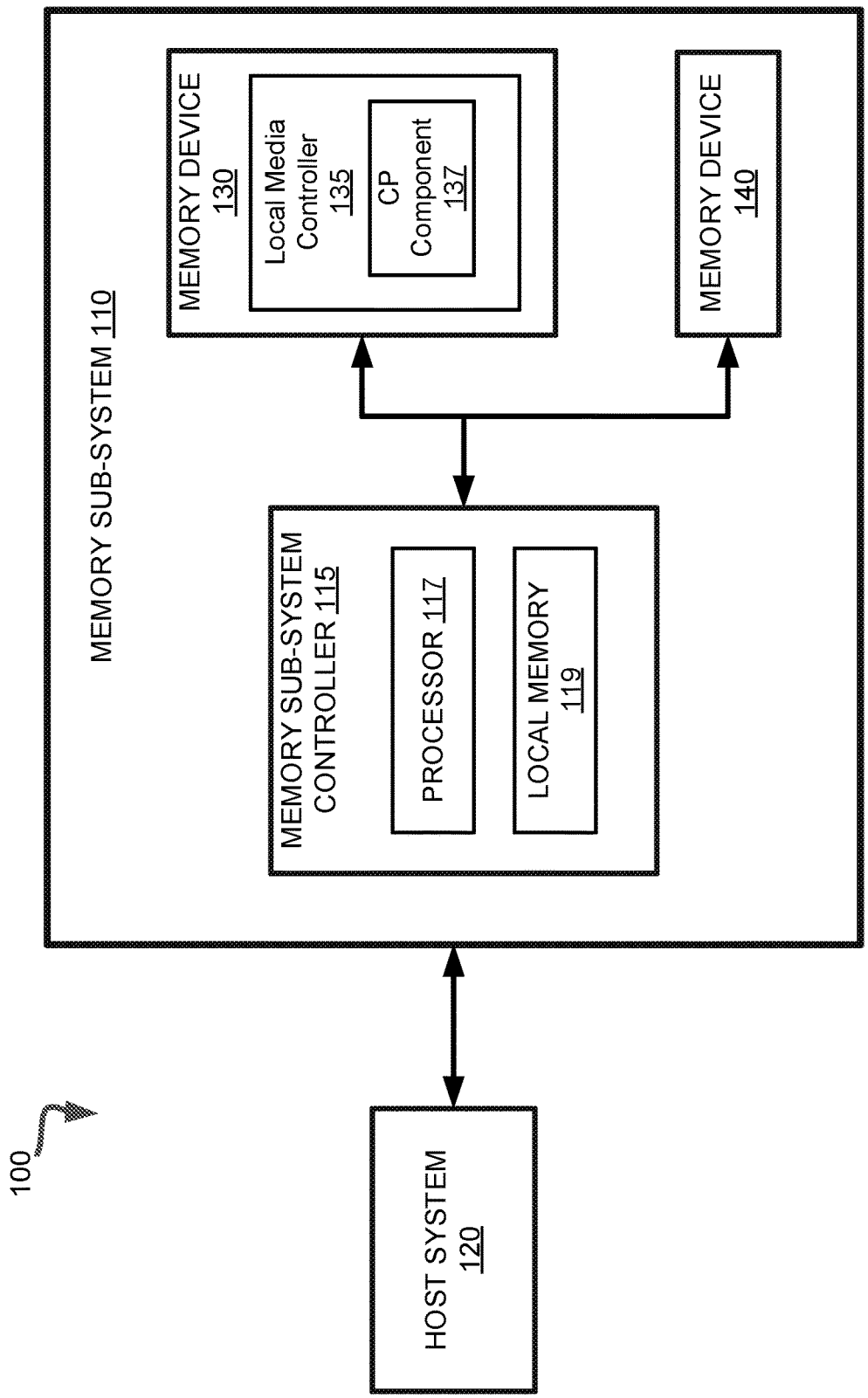
FIG. 1A illustrates an example computing system that includes a memory sub-system, in accordance with some embodiments of the present disclosure.

Aspects of the present disclosure are directed to concurrent programming of retired wordline cells with dummy data. A memory sub-system can be a storage device, a memory module, or a combination of a storage device and memory module. Examples of storage devices and memory modules are described below in conjunction with FIGS. 1A-1B. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIGS. 1A-1B. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells. A memory cell is an electronic circuit that stores information. Depending on the memory cell type, a memory cell can store one or more bits of binary information, and has various logic states that correlate to the number of bits being stored. The logic states can be represented by binary values, such as "0" and "1", or combinations of such values.

A memory device can include multiple memory cells arranged in a two-dimensional or three-dimensional grid. Memory cells are formed onto a silicon wafer in an array of columns and rows. A memory device can further include conductive lines connected to respective ones of the memory cells, referred to as wordlines and bitlines. A wordline can refer to one or more rows of memory cells of the memory device and a bitline can refer to one or more columns of memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

A memory cell can be programmed (written to) by applying a certain voltage to the memory cell, which results in an electric charge being held by the memory cell. For example, a voltage signal $V_{CG}$ that can be applied to a control electrode of the cell to open the cell to the flow of electric current across the cell, between a source electrode and a drain electrode. More specifically, for each individual memory cell (having a charge Q stored thereon) there can be a threshold control gate voltage $V_T$ (herein also referred to as the "threshold voltage" or simply as "threshold") such that the source-drain electric current is low for the control gate voltage ($V_{CG}$) being below the threshold voltage, $V_{CG}<V_T$. The current increases substantially once the control gate voltage has exceeded the threshold voltage, $V_{CG}>V_T$. Because the actual geometry of the electrodes and gates varies from cell to cell, the threshold voltages can be different even for cells implemented on the same die. The memory cells can, therefore, be characterized by a distribution P of the threshold voltages, $P(Q, V_T)=dW/dV_T$, where dW represents the probability that any given cell has its threshold voltage within the interval $[V_T, V_T+dV_T]$ when charge Q is placed on the cell.

A memory device can have distributions $P(Q, V_T)$ that are narrow compared with the working range of control voltages tolerated by the cells of the device. Accordingly, multiple non-overlapping distributions $P(Q_k, V_T)$ ("valleys") can be fit into the working range allowing for storage and reliable detection of multiple values of the charge $Q_k$, k=1, 2, 3 . . . . The distributions (valleys) are interspersed with voltage intervals ("valley margins") where none (or very few) of the memory cells of the device have their threshold voltages. Such valley margins can, therefore, be used to separate various charge states $Q_k$—the logical state of the cell can be determined by detecting, during a read operation, between which two valley margins the respective threshold voltage $V_T$ of the cell resides. This effectively allows a single memory cell to store multiple bits of information: a memory cell operated with 2N−1 well-defined valley margins and 2N valleys is capable of reliably storing N bits of information. Specifically, the read operation can be performed by comparing the measured threshold voltage $V_T$ exhibited by the memory cell to one or more reference voltage levels corresponding to known valley margins (e.g., centers of the margins) of the memory device.

One type of memory cell ("cell") is a single level cell (SLC), which stores 1 bit per cell and defines 2 data states ("states") ("1" or "L0" and "0" or "L1") each corresponding to a respective $V_T$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_T$ level. For example, the "11" state can be an erased state and the "01", "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_T$ level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. Thus, an n-level cell can use 2" levels of charge to store n bits. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of memory cells.

A read window, which may be referred to as a read window width or "valley margin," refers to a distance (e.g., voltage distance) between $V_T$ distributions at a particular bit error rate (BER). The BER can correspond to a probability of error for a given bit that is transmitted across a channel. BER can increase gradually as the number of program/erase cycles, read cycles, and retention time increases. For example, the BER can be a raw bit error rate (RBER), which indicates BER before implementing error correction code (ECC). RBER can be defined as a ratio between the number of bits with errors and the total number of bits that have been analyzed using ECC.

Read window budget (RWB) can refer to a cumulative value of read windows for a group of programmed cells (e.g., one or more pages). RWB is a metric that can be used to assess the health or endurance of a memory device. For example, cells configured to store three bits of data per cell may be programmed to one of eight different $V_T$ distributions, each corresponding to a respective data state. In this example, the RWB can be the cumulative value (e.g., voltage) of the seven read windows between the eight $V_T$ distributions. The RWB corresponding to a group of programmed cells can be affected by various factors such as temperature, wear cycling (e.g., program/erase cycles), etc. Therefore, RWB(s) can vary over time, which can affect system quality of service (QoS), reliability, and/or performance. A memory device can exhibit wordline to wordline variation within a particular block with weaker wordlines dictating memory array endurance, where these weaker wordlines can be associated with lower RWB values.

Retiring refers to the process of stopping the use of a set of cells for purposes of host data programming due to unreliability and/or poor performance. For example, controller firmware can implement a background media scan operation to identify cells that should be retired, and store an indication of the retired cells within a list or table. In some embodiments, the identification is made based on BER. For example, BER (e.g., RBER) can be compared to a threshold corresponding to a maximum allowable BER. Illustratively, in the case of RBER, the threshold can correspond to an RBER ratio of about 0.01. However, such an example should not be considered limiting.

It is possible to retire an entire block of the memory device, where data on the block is migrated to another block on the memory device prior to retirement. However, as the size of blocks of memory devices (e.g., NAND memory devices) increases to reduce the total number of blocks of a memory device (e.g., as the number of sub-blocks per block increases), it is becoming progressively more inefficient to retire an entire block. A sub-block refers to a grouping of cells of a block that are connected to a particular bitline. For example, if a memory device includes 1,000 blocks, then retiring a single block constitutes a 0.1% reduction, which is a relatively insignificant loss. However, if a memory device includes 100 blocks, then retiring a single block constitutes a 1% reduction, which is a more significant loss.

Instead of retiring an entire block, it may be possible to retire a portion of a block. For example, an entire page of cells can be retired, which retires all cells connected to the wordline defining the page, also referred to as a retired wordline. That is, cells addressable by weaker wordlines of the can be retired to preserve the block for additional program/erase cycles and to increase the endurance of the block (e.g., increase the terabytes written (TBW)). For example, as mentioned above, controller firmware can implement a background media scan to identify weaker wordlines that should be retired based on a metric such as BER (e.g., RBER).

Cells of the memory device are tuned during manufacturing to account for cell-to-cell interactions between programmed cells. To that end, simply erasing the cells corresponding to retired wordlines can impact the performance of the cells corresponding to the remaining data wordlines to which host data is written. To maintain the performance of the remaining (active) cells, the retired cells, the memory cells that are selectively connected to the retired wordlines can be programmed with dummy data prior to resuming host data writes to the remaining (active) cells. Otherwise, leaving these pages of memory cells unwritten can create unwanted memory cell reliability and trigger rate ramifications at memory cells selectively connected to adjacent wordlines. Dummy data can be random or meaningless data, e.g., pseudo-random data, all one values, all zero values, or a combination thereof. To perform dummy data programming in these memory devices, the local media controller on the memory device (e.g., NAND controller) can receive, from a memory sub-system controller (e.g., SSD controller), a program command that includes the dummy data so that the memory device can transparently program memory cells selectively connected to the retired wordlines with the dummy data. For example, the memory device can act on the program command as any other program command, and no update to control logic of the memory device is necessary.

Some memory devices can sequentially program retired wordline cells with dummy data on a per-wordline and a per-sub-block basis. However, this sequential manner of programming can cause write performance degradation as the host system has to wait for each dummy data write operation to complete before writing host data to the active or non-retired cells. For example, if a memory device is retiring 3 consecutive wordlines located across 4 sub-blocks, the host system would wait for a total page programming time ("tPROG") of 12 to retire all 3 wordlines across the 4 sub-blocks. Accordingly, sequentially programming cells connected to retired wordlines with dummy data can introduce memory device performance issues.

Aspects of the present disclosure address the above and other deficiencies by implementing concurrent programming of retired wordline cells with dummy data. In some embodiments, performing the concurrent programming includes applying a ganged programming pulse. Ganged programming refers to the blind programming of multiple pages of cells and sub-blocks simultaneously within the same plane, irrespective of the reliability of the pages. Blind programming refers to pattern-less programming in which every bit is programmed to achieve a wide distribution without realizing a number of unique states (e.g., without realizing 2 states for a single-level cell (SLC), 4 states for a multi-level cell (MLC), or 8 states for a triple-level cell (TLC)). For example, the ganged programming pulse can achieve a wider distribution as compared to a standalone programming pulse. In some embodiments, the ganged programming pulse has an amplitude ranging from about 15 V to about 25 V. In some embodiments, the ganged programming pulse has an amplitude ranging from about 18 V to about 20 V. In some embodiments, the ganged programming pulse has a pulse width ranging from about 20 microseconds to about 40 microseconds. In some embodiments, the ganged programming pulse has a pulse width ranging from about 25 microseconds to about 35 microseconds. Accordingly, multiple pages of cells corresponding to multiple wordlines designated for retirement across multiple selected sub-blocks can be atomically programmed with dummy data by applying a ganged programming pulse, as opposed to being sequentially programmed on a per-wordline and/or per-sub-block basis.

To implement the concurrent programming of retired wordline cells with dummy data, the local media controller of the memory device (e.g., NAND controller) can obtain dummy data. In some embodiments, the local media controller can receive the dummy data from the memory sub-system controller (e.g., SSD controller). In some embodiments, the local media controller can generate the dummy data locally, instead of receiving the dummy data from the memory sub-system controller, to avoid a performance penalty resulting from the data transfer. The local media controller can then enable the concurrent programming of the retired wordline cells with the dummy data. In some embodiments, the local media controller can utilize ganged programming of the dummy data with respect to cells corresponding to multiple sub-blocks and/or a cluster of adjacent wordlines. For example, the local controller can use a ganged programming pulse (e.g., blind pulse) to program random threshold voltage distributions (e.g., SLC/MLC/TLC distributions) without program-verify, which can reduce the tPROG to a single pulse. In some embodiments, the memory device (e.g., NAND) can include a command register assigned for the ganged programming pulse. The memory sub-system controller can utilize a set of commands that instruct the local media controller to perform the concurrent programming of retired wordline cells with dummy data. For example, the set of commands can, instead of addressing a single page, address an initial page and a final page. The local media controller can then know to set the architecture such that the programming pulse is expanded across the range of pages defined by the initial page and the final page, which translates into the cells of the corresponding range of retired wordlines. Accordingly, the ganged programming pulse can define a particular dummy data programming pattern indicated by the set of commands.

The performance savings can be proportional to the number of wordlines and/or number of sub-blocks that are concurrently programmed during the blind programming. For example, if the memory device is retiring 3 wordlines located across 4 sub-blocks as described above, the cells across the multiple sub-blocks can be concurrently programmed with dummy data using the ganged programming approach described herein to reduce tPROG from 12 to 1. Additionally, even if a single wordline is being retired utilizing the concurrent programming approach described herein, there are still performance improvements as only a single programming pulse is needed to retire the single wordline across all sub-blocks, instead of a number of standalone programming pulses equal to the number of sub-blocks (e.g., instead of 4 standalone programming pulses if there are 4 sub-blocks). Accordingly, embodiments described herein provide can enable clustered wordline retirement without issuing sequential, standalone dummy data programming commands, which can reduce voltage stress and improve memory device performance and endurance.

Advantages of the present disclosure include, but are not limited to, improved memory device reliability and performance.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Pillar, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level memory cells (SLC) can store one bit per memory cell. Other types of memory cells, such as multi-level memory cells (MLCs), triple level memory cells (TLCs), quad-level memory cells (QLCs), and penta-level memory cells (PLCs) can store multiple bits per memory cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The local media controller 135 can implement a concurrent programming (CP) component 137 that can implement concurrent programming of dummy data. More specifically, the CP component 137 can receive an indication of a group of retired wordlines, and concurrently program cells of the group of retired wordlines with dummy data. For example, the group of retired wordlines can be identified using a background media scan that identifies cells with sufficiently high BERs. In some embodiments, the CP component 137 can receive a set of commands that define the group of retired wordlines to which cells will be concurrently programmed with dummy data. For example, the CP component 137 can receive a set of commands that defines a range of pages including an initial page and a final page corresponding to the group of retired wordlines.

In some embodiments, the CP component 137 receives the dummy data external to the memory device 130 (e.g., from the memory sub-system controller 115). In some embodiments, instead of receiving the dummy data external to the memory device 130 (e.g., from the memory sub-system controller 115), the CP component 137 can generate a set of random data corresponding to the dummy data internally in the memory device 130.

In some embodiments, the CP component 137 utilizes a ganged programming pulse to simultaneously program dummy data on cells within a group of retired wordlines across multiple sub-blocks (e.g., every sub-block). The ganged programming pulse can be a blind programming pulse that programs random threshold voltage distributions (e.g., SLC/MLC/TLC distributions). Program-verify is an operation performed after programming a cell to determine whether the threshold voltage of the cell has increased to the target programmed level. Therefore, since the ganged programming pulse is used to randomly/blindly program cells corresponding to retired wordline(s) with dummy data, there is no need to perform the program-verify operation. Further details regarding the operations of the CP component 137 will be described below with reference to FIGS. 4-5.

Figure 1B:
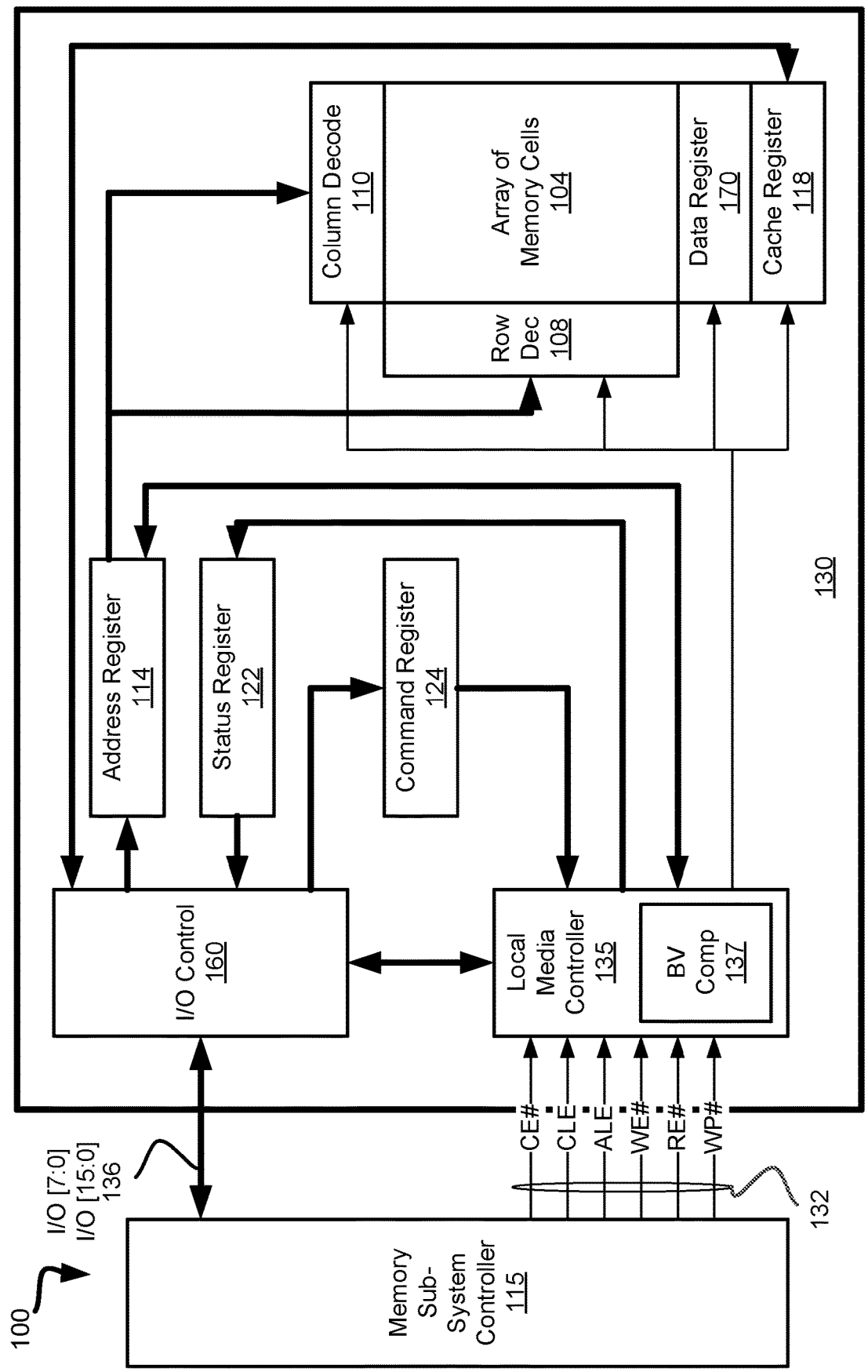
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are connected to the same access line (e.g., a wordline) while memory cells of a logical column are selectively connected to the same data line (e.g., a bitline). A single access line may be associated with more than one logical row of memory cells and a single data line may be associated with more than one logical column. Memory cells (not shown in FIG. 1B) of at least a portion of array of memory cells 104 are capable of being programmed to one of at least two target data sta.

Row decode circuitry 108 and column decode circuitry 110 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 110 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 110 to control the row decode circuitry 108 and column decode circuitry 110 in response to the addresses. In one embodiment, local media controller 135 includes the CP component 137, which can implement the defect detection described herein during an erase operation on memory device 130.

The local media controller 135 is also in communication with a cache register 118. Cache register 118 latches data, either incoming or outgoing, as directed by the local media controller 135 to temporarily store data while the array of memory cells 104 is busy writing or reading, respectively, other data. During a program operation (e.g., write operation), data may be passed from the cache register 118 to the data register 170 for transfer to the array of memory cells 104; then new data may be latched in the cache register 118 from the I/O control circuitry 160. During a read operation, data may be passed from the cache register 118 to the I/O control circuitry 160 for output to the memory sub-system controller 115; then new data may be passed from the data register 170 to the cache register 118. The cache register 118 and/or the data register 170 may form (e.g., may form a portion of) a page buffer of the memory device 130. A page buffer may further include sensing devices (not shown in FIG. 1B) to sense a data state of a memory cell of the array of memory cells 204, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 136 and outputs data to the memory sub-system controller 115 over I/O bus 136.

For example, the commands may be received over input/output (I/O) pins [7:0] of I/O bus 136 at I/O control circuitry 160 and may then be written into command register 124. The addresses may be received over input/output (I/O) pins [7:0] of I/O bus 136 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 118. The data may be subsequently written into data register 170 for programming the array of memory cells 104.

In an embodiment, cache register 118 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIGS. 1A-1B has been simplified. It should be recognized that the functionality of the various block components described with reference to FIGS. 1A-1B may not necessarily be segregated to distinct components or component portions of an integrated circuit device. For example, a single component or component portion of an integrated circuit device could be adapted to perform the functionality of more than one block component of FIGS. 1A-1B. Alternatively, one or more components or component portions of an integrated circuit device could be combined to perform the functionality of a single block component of FIGS. 1A-1B. Additionally, while specific I/O pins are described in accordance with popular conventions for receipt and output of the various signals, it is noted that other combinations or numbers of I/O pins (or other I/O node structures) may be used in the various embodiments.

Figure 3:
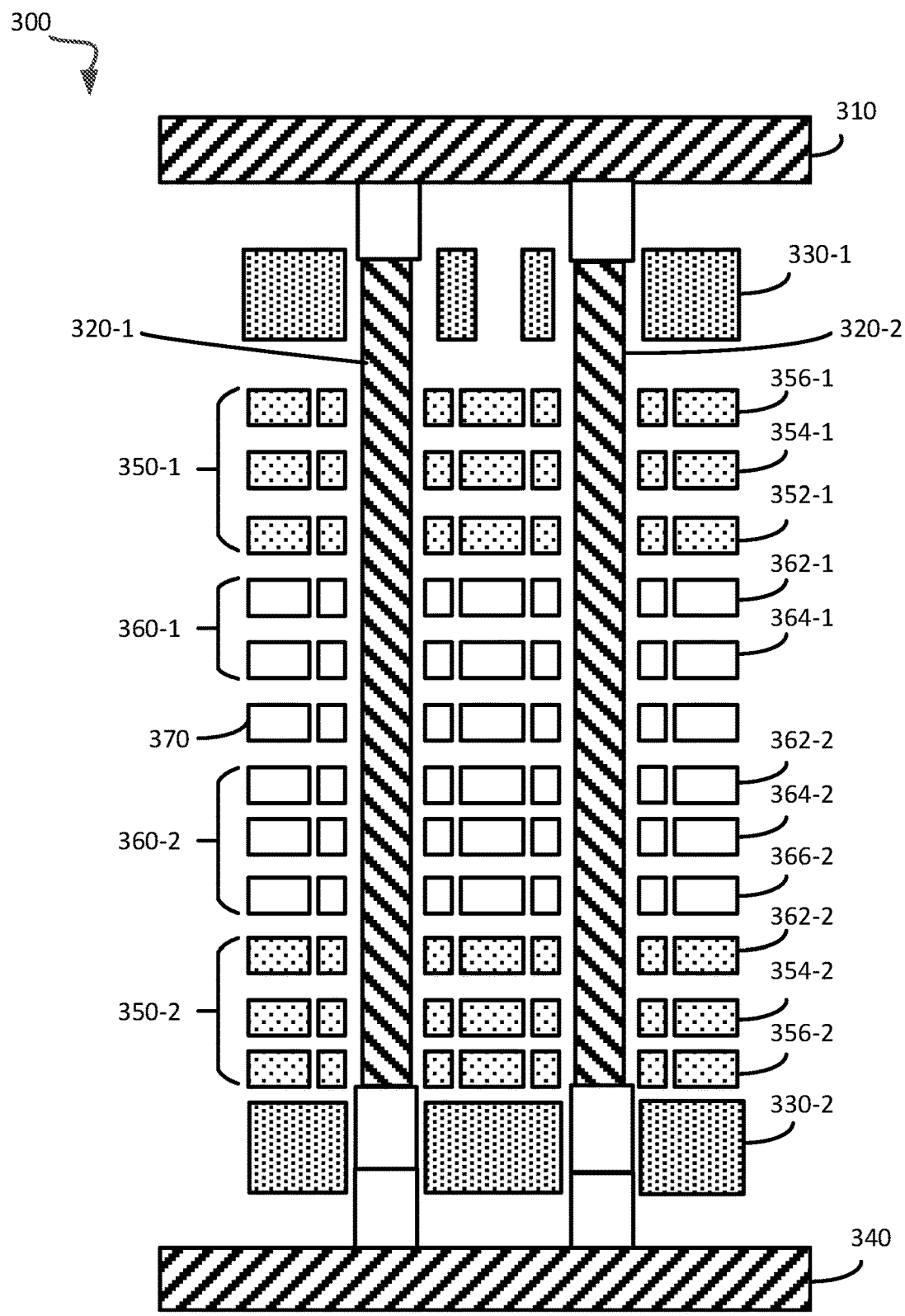
FIG. 3 is a diagram of an example three-dimensional (3D) replacement gate memory device that can implement concurrent programming of retired wordline cells with dummy data, in accordance with some embodiments of the present disclosure.

FIG. 3 is a diagram of an example three-dimensional (3D) replacement gate memory device ("device") 300 that can implement concurrent programming of retired wordline cells with dummy data, in accordance with some embodiments of the present disclosure. However, the embodiments described herein can be applied to any suitable memory device.

As shown, the device 300 includes a bitline contact 310, pillars 320-1 and 320-2, select gates (SGs) 330-1 and 330-2, a source line contact 340, and WL groups 350-1, 350-2, 360-1 and 360-2. More specifically, WL groups 350-1 and 350-2 are dummy WL groups, and WL groups 360-1 and 360-2 are data WL groups. WL group 350-1 includes dummy WLs 352-1 through 366-1, WL group 650-2 includes dummy WLs 352-2 through 356-2, WL group 360-1 includes active WLs 362-1 and 364-1, and WL group 360-2 includes data WLs 362-2, 364-2 and 366-2. However, such an example should not be considered limiting. A dummy WL corresponds to memory cells that do not store dummy data (not host data) and are included to satisfy processing margins, while an active or data WL corresponds to memory cells that store host data. For example, a dummy WL can be a retired WL.

As further shown, a WL 370 is provided. In some embodiments, the device 300 is a multiple deck device, in which WL groups 350-1 and 360-1 are associated with a first deck (e.g., an upper deck) of the device 300 and the WL groups 350-2 and 360-2 are associated with a second deck (e.g., a lower deck) of the device 300, such that the WL 370 corresponds to a dummy WL separating the WL groups 360-1 and 360-2. In other embodiments, the device 300 is a "single deck" device, in which the WL groups 360-1 and 360-2 are not arranged in decks. Here, the WL 370 can be an active WL within one of the WL groups 360-1 or 360-2.

Figure 4:
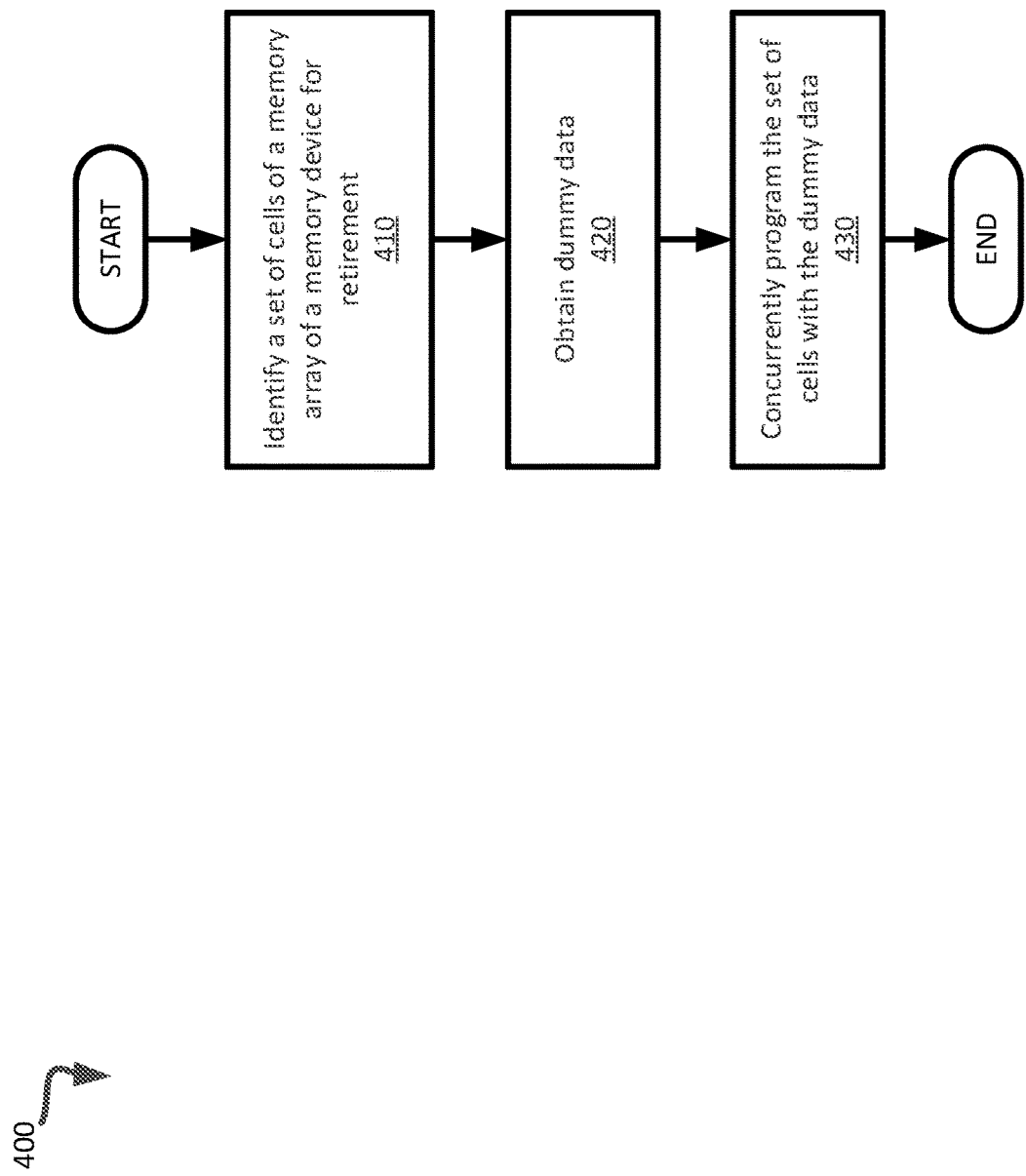
FIG. 4 is a flow diagram of a method to perform concurrent programming of retired wordline cells with dummy data, in accordance with some embodiments of the present disclosure.

FIG. 4 is a flow diagram of an example method 400 to perform concurrent programming of retired wordline cells with dummy data, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the CP component 137 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, a set of cells of a memory array of a memory device is identified for retirement. For example, the processing logic (e.g., CP component 137 implemented by the local media controller 135) can identify the set of cells. The memory array can be a block of the memory device. In some embodiments, the set of cells includes a single cell. In some embodiments, the set of cells includes a plurality of cells. The set of cells can correspond to a group of retired wordlines of a plurality of wordlines of the memory device, where the plurality of wordlines further includes a group of data wordlines that receive host data. The memory array can include a number of sub-blocks, and each wordline of the block (e.g., retired wordline and data wordline) can expand across the sub-blocks. In some embodiments, the memory device is a 3D replacement gate memory device (e.g., 3D replacement gate NAND). In some embodiments, identifying the set of cells comprises receiving a set of commands to concurrently program the set of cells with dummy data. For example, the set of commands can define a range of pages or wordlines including an initial page or wordline and a final page or wordline, which translates into the group of retired wordlines.

At operation 420, dummy data is obtained. For example, the processing logic obtains the dummy data. For example, the dummy data can correspond to a set of random data. In some embodiments, the processing logic generates the dummy data. For example, the processing logic can generate a set of random data corresponding to the dummy data. In some embodiments, the processing logic receives the dummy data.

Figure 2A:
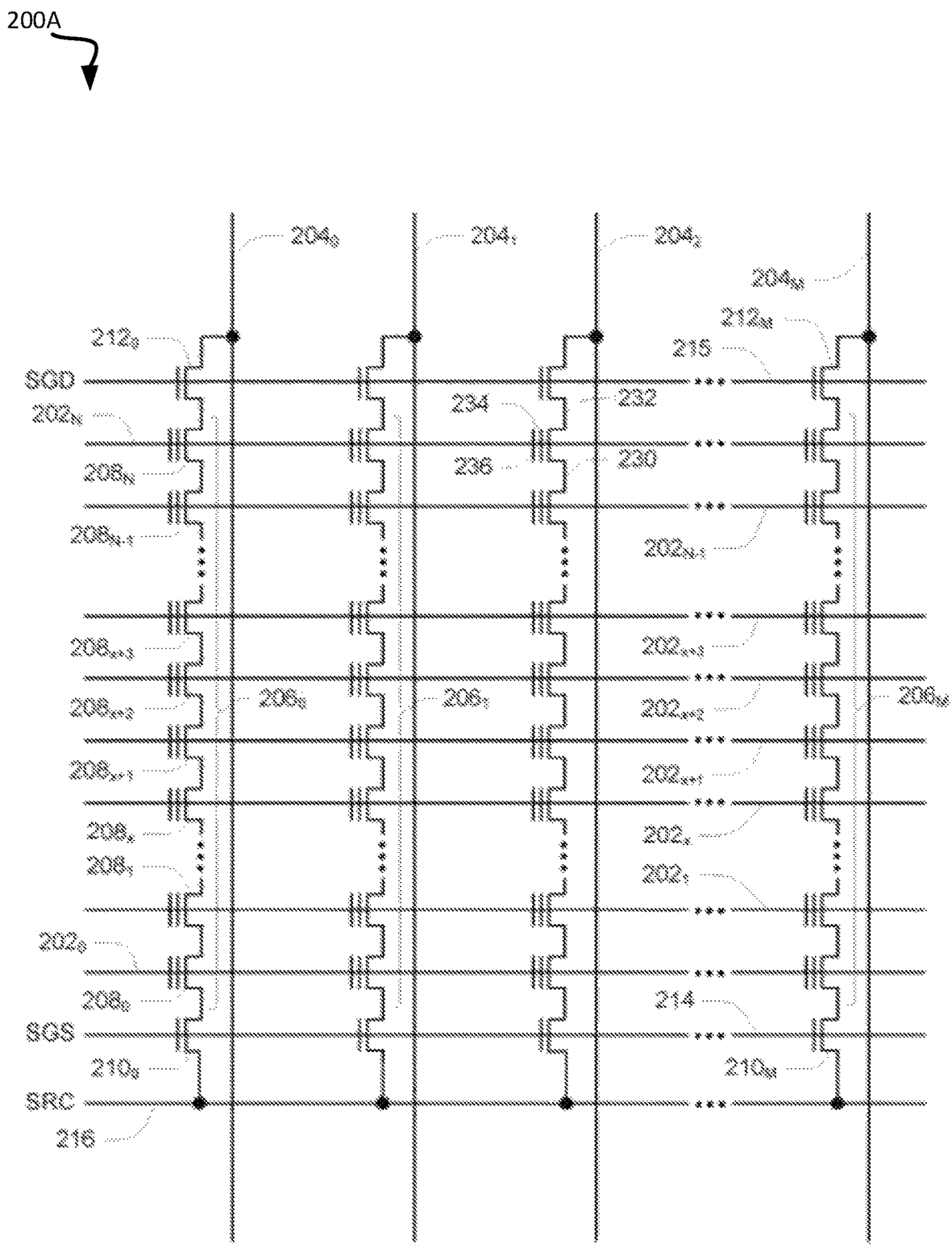
FIGS. 2A-2C are diagrams of portions of an example array of memory cells included in a memory device, in accordance with some embodiments of the present disclosure.
Figure 2B:
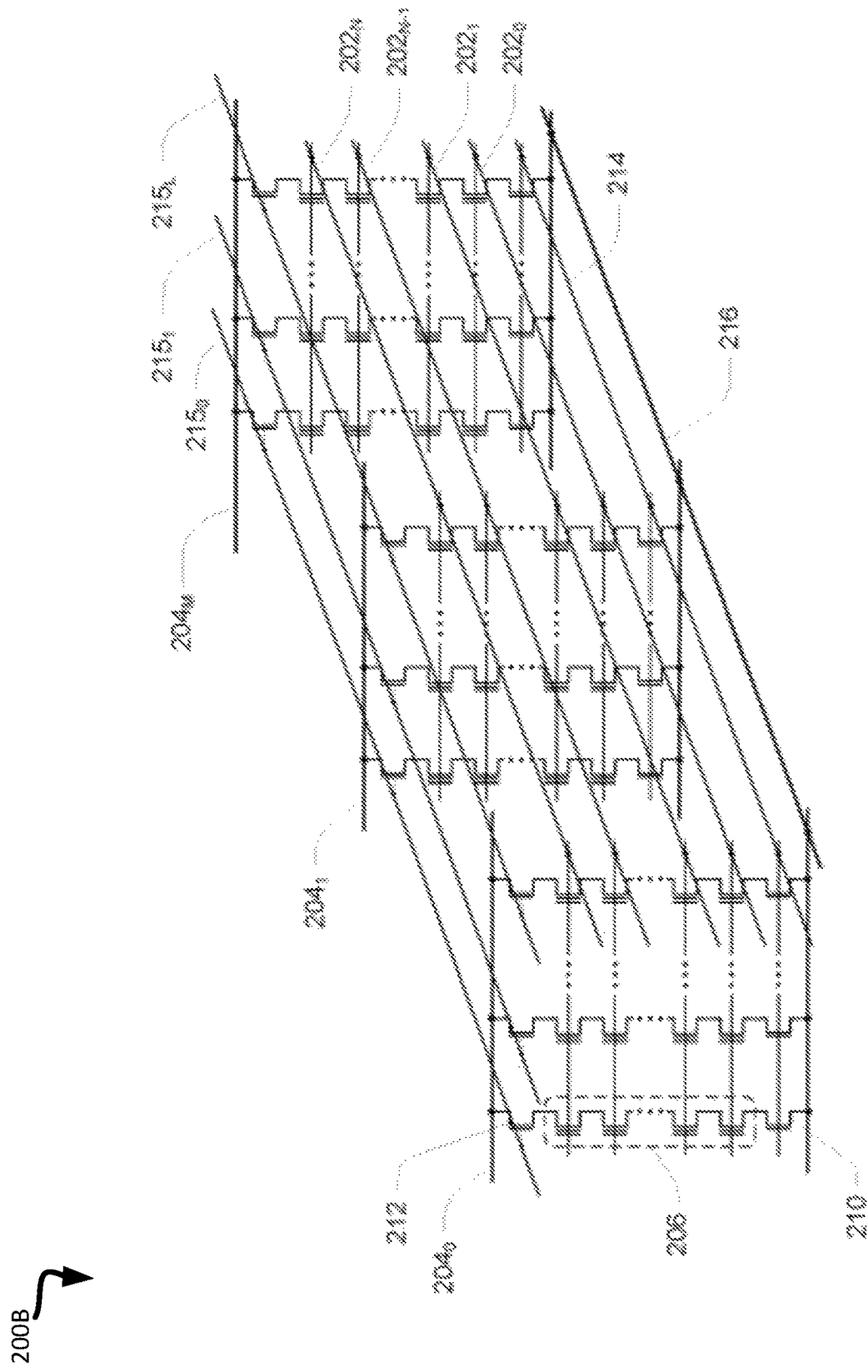
Figure 2C:
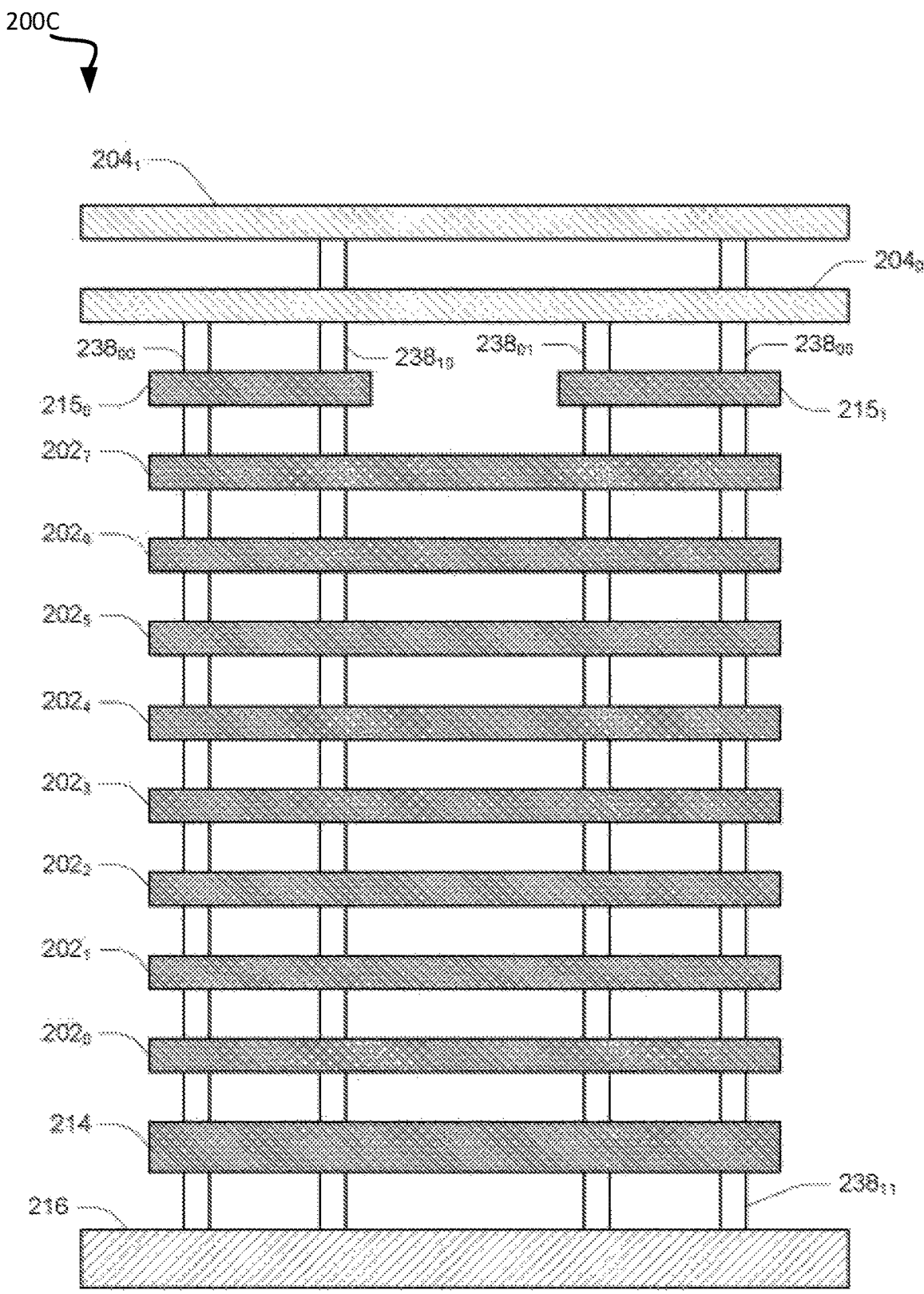

At operation 430, the set of cells is concurrently programmed with the dummy data. For example, the processing logic can cause the set of cells to be concurrently programmed with the dummy data by causing a ganged programming pulse to be applied to the set of cells. In some embodiments, the ganged programming pulse is a blind programming pulse. A blind programming pulse can program random threshold voltage distributions (e.g., SLC/MLC/TLC distributions) without program-verify, which can reduce tPROG of dummy data programming to a single pulse. Even if the group of retired wordlines includes a single wordline, there are performance improvements as only a single programming pulse is needed to retire the single wordline across all sub-blocks, instead of a number of programming pulses equal to the number of sub-blocks. Further details regarding operations 410-430 are described above with reference to FIGS. 1-3 and will be described below with reference to FIG. 5.

Figure 5:
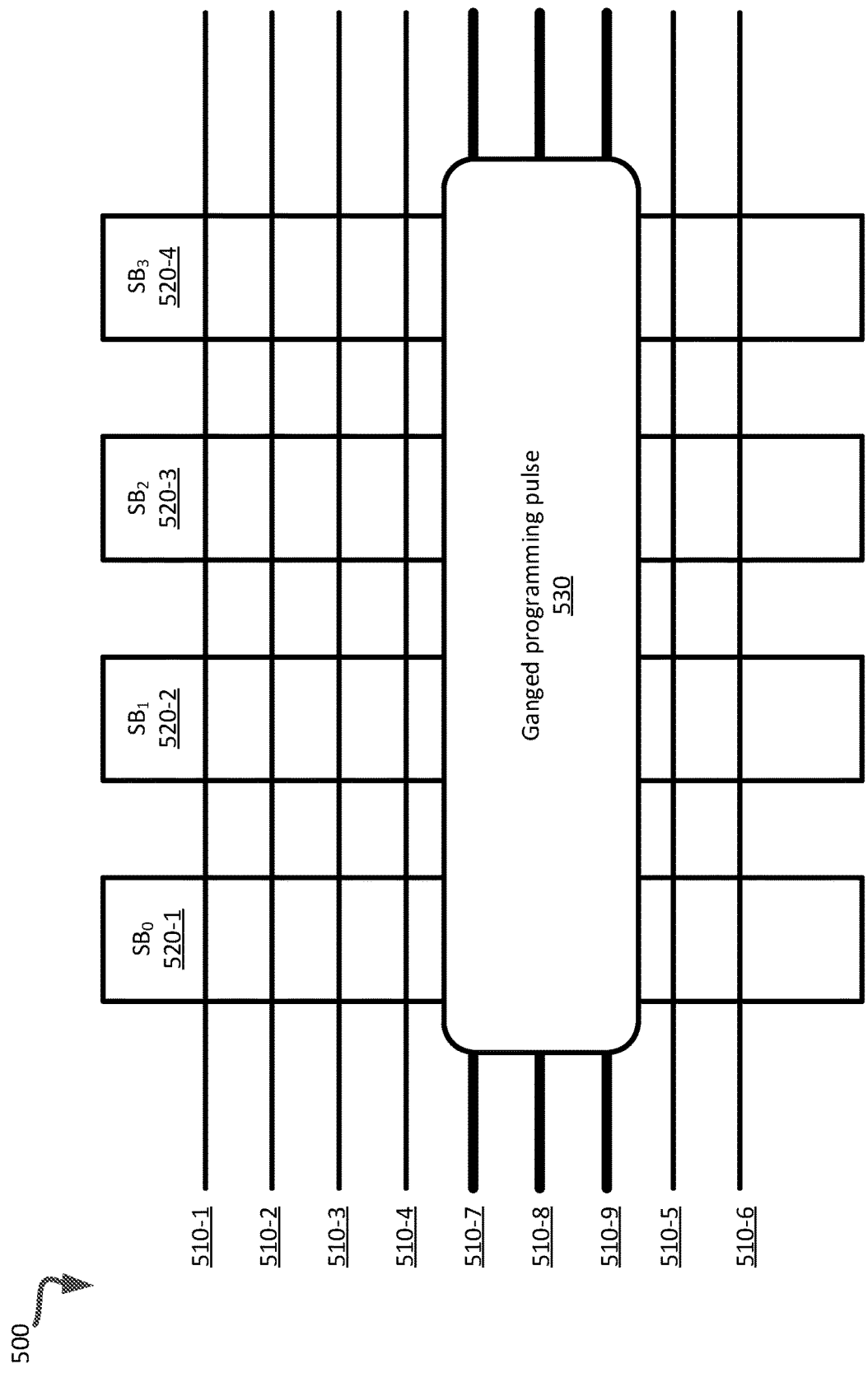
FIG. 5 is a block diagram of a memory device in which retired wordline cells are concurrently programmed with dummy data, in accordance with some embodiments of the present disclosure.

FIG. 5 is a block diagram of a memory device 500 in which retired wordline cells are concurrently programmed with dummy data, in accordance with some embodiments of the present disclosure. As shown, the memory device 500 includes a number of wordlines including wordlines 510-1 through 510-9. Although 9 wordlines are shown, the number of wordlines should not be considered limiting. The memory device 500 further includes a number of sub-blocks including sub-blocks $SB_0$ 520-1 through $SB_3$ 520-4. Although 4 sub-blocks are shown, the number of sub-blocks should not be considered limiting.

In this illustrative example, wordlines 510-1 through 510-6 correspond to active or data wordlines, while wordlines 510-7 through 510-9 correspond to retired wordlines. As shown, a ganged programming pulse 530 is applied to cells connected to the retired wordlines 510-7 through 510-9. In some embodiments, the ganged programming pulse 530 has an amplitude ranging from about 15 V to about 25 V. In some embodiments, the ganged programming pulse 530 has an amplitude ranging from about 18 V to about 20 V. In some embodiments, the ganged programming pulse 530 has a pulse width ranging from about 20 microseconds to about 40 microseconds. In some embodiments, the ganged programming pulse 530 has a pulse width ranging from about 25 microseconds to about 35 microseconds.

The ganged programming pulse 530 can be applied to the retired wordlines 510-7 through 510-9 by a local media controller (e.g., local media controller 115 of FIG. 1A) to concurrently program dummy data onto the cells connected to the retired wordlines 510-7 through 510-9 across at least the sub-blocks $SB_0$ 520-1 through $SB_3$ 520-4. For example, the ganged programming pulse 530 can be a blind programming pulse that randomly programs distributions without requiring program-verify. That is, the tPROG for concurrently programming the dummy data with respect to the retired wordlines 510-7 through 510-9 utilizing the ganged programming pulse 530 is 1. In contrast, the tPROG for sequentially programming the dummy data with respect to the retired wordlines 510-7 through 510-9 utilizing standalone programming pulses is 12 (i.e., 3 wordlines across 4 sub-blocks). Accordingly, concurrently programming dummy data with respect to the retired wordlines 510-7 through 510-9 simultaneously across the sub-blocks (e.g., using a single command) leads to improved efficiency and performance as compared to sequentially programming the dummy data with respect to the retired wordlines 510-7 through 510-9 on a per-wordline and per-sub-block basis (e.g., using individual standalone commands).

Figure 6:
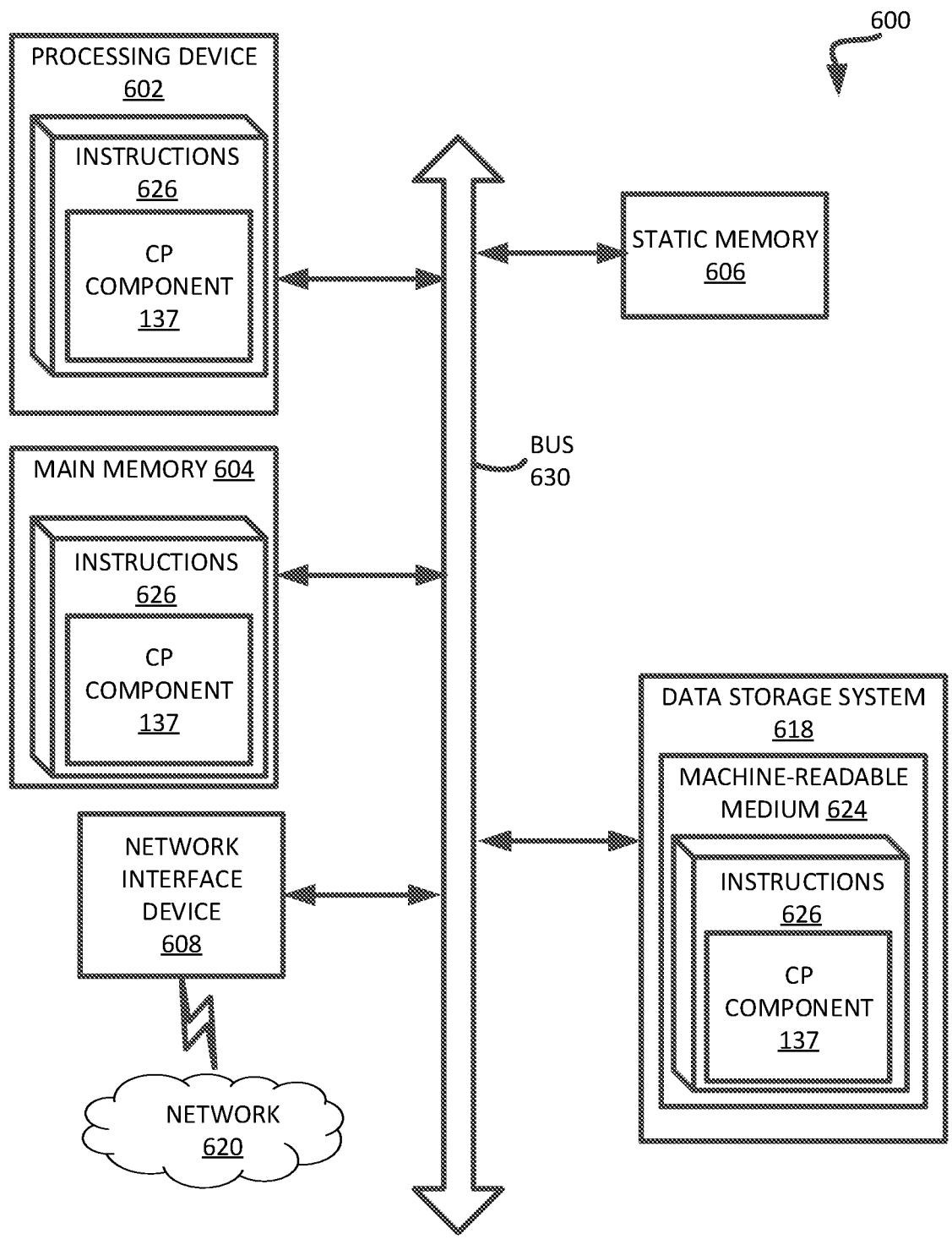
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the CP component 137 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a memory cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1A.

In one embodiment, the instructions 626 include instructions to implement functionality corresponding to a CP component (e.g., the CP component 137 of FIG. 1A). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
   a memory array comprising a plurality of wordlines; and
   control logic, operatively coupled with the memory array, to perform operations comprising:
   identifying a set of cells of the memory array for retirement, the set of cells corresponding to a group of retired wordlines of the plurality of wordlines;
   generating dummy data to be programmed on the set of cells; and
   concurrently programming the set of cells with the dummy data by causing a ganged programming pulse to be applied to the set of cells.

2. The memory device of claim 1, wherein the ganged programming pulse is a blind programming pulse.

3. The memory device of claim 1, wherein the memory array further comprises a set of sub-blocks, and wherein concurrently programming the set of cells with the dummy data further comprises programming the set of cells across each sub-block of the set of sub-blocks simultaneously.

4. The memory device of claim 1, wherein identifying the set of cells comprises receiving a set of commands.

5. The memory device of claim 4, wherein the set of commands define an initial page and a final page of the group of retired wordlines.

6. The memory device of claim 1, wherein generating the dummy data comprises generating a set of random data.

7. The memory device of claim 1, wherein the memory device comprises a three-dimensional (3D) replacement gate memory device.

8. A method comprising:
   identifying, by a processing device, a set of cells of a memory array of a memory device for retirement, the set of cells corresponding to a group of retired wordlines of a plurality of wordlines of the memory array;
   obtaining, by the processing device, dummy data to be programmed on the set of cells; and
   concurrently programming, by the processing device, the set of cells with the dummy data by causing a ganged programming pulse to be applied to the set of cells.

9. The method of claim 8, wherein the ganged programming pulse is a blind programming pulse.

10. The method of claim 8, wherein the memory array further comprises a set of sub-blocks, and wherein concurrently programming the set of cells with the dummy data further comprises programming the set of cells across each sub-block of the set of sub-blocks simultaneously.

11. The method of claim 8, wherein identifying the set of cells comprises receiving a set of commands.

12. The method of claim 11, wherein the set of commands define an initial page and a final page of the group of retired wordlines.

13. The method of claim 8, wherein generating the dummy data comprises generating a set of random data.

14. The method of claim 8, wherein the memory device comprises a three-dimensional (3D) replacement gate memory device.

15. A non-transitory computer-readable storage medium comprising instructions that, when executed by a processing device, cause the processing device to perform operations comprising:
   determining that a set of cells of a memory array is to be programmed with dummy data, the set of cells corresponding to a group of retired wordlines of a plurality of wordlines;
   obtaining the dummy data; and
   concurrently programming the set of cells with the dummy data by causing a ganged programming pulse to be applied to the set of cells, wherein the ganged programming pulse is a blind programming pulse.

16. The non-transitory computer-readable storage medium of claim 15, wherein the memory array further comprises a set of sub-blocks.

17. The non-transitory computer-readable storage medium of claim 16, wherein concurrently programming the set of cells with the dummy data further comprises programming the set of cells across each sub-block of the set of sub-blocks simultaneously.

18. The non-transitory computer-readable storage medium of claim 15, wherein the operations further comprise identifying an initial page and a final page of the group of retired wordlines.

19. The non-transitory computer-readable storage medium of claim 15, wherein obtaining the dummy data comprises generating a set of random data corresponding to the dummy data.

20. The non-transitory computer-readable storage medium of claim 15, wherein the the memory array is comprised within a three-dimensional (3D) replacement gate memory device.

* * * * *